(12) United States Patent
Lin et al.

(10) Patent No.: US 10,103,132 B2
(45) Date of Patent: Oct. 16, 2018

(54) SEMICONDUCTOR DEVICE AND METHOD OF MANUFACTURES

(71) Applicant: Taiwan Semiconductor Manufacturing Company, Ltd., Hsin-Chu (TW)

(72) Inventors: Jing-Cheng Lin, Hsin-Chu (TW); Po-Hao Tsai, Zhongli (TW); Li-Hui Cheng, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/433,721

(22) Filed: Feb. 15, 2017

(65) Prior Publication Data

US 2017/0162551 A1    Jun. 8, 2017

Related U.S. Application Data

(62) Division of application No. 14/604,603, filed on Jan. 23, 2015, now Pat. No. 9,583,420.

(51) Int. Cl.

| H01L 21/00 | (2006.01) |
| H01L 25/10 | (2006.01) |
| H01L 23/538 | (2006.01) |
| H01L 23/31 | (2006.01) |
| H01L 21/48 | (2006.01) |

(Continued)

(52) U.S. Cl.
CPC .......... *H01L 25/105* (2013.01); *H01L 21/486* (2013.01); *H01L 21/4853* (2013.01); *H01L 21/565* (2013.01); *H01L 23/3114* (2013.01); *H01L 23/5384* (2013.01); *H01L 23/5386* (2013.01); *H01L 23/5389* (2013.01); *H01L 25/50* (2013.01); *H01L 2225/1035* (2013.01); *H01L 2225/1058* (2013.01)

(58) Field of Classification Search
CPC ............... H01L 25/105; H01L 23/8398; H01L 23/5384; H01L 23/5386; H01L 23/3114; H01L 21/4852; H01L 31/486; H01L 21/565; H01L 25/0657; H01L 25/50; H01L 2225/1058; H01L 2225/1035; H01L 2924/01079
USPC ........... 438/51, 55, 108, 109, 112, 124, 620; 257/686, 687, 698, E21.507, E21.508
See application file for complete search history.

(56) References Cited

U.S. PATENT DOCUMENTS

| 5,634,268 A | 6/1997 | Dalal et al. |
| 6,333,561 B1 | 12/2001 | Chen |

(Continued)

FOREIGN PATENT DOCUMENTS

| CN | 1359151 A | 7/2002 |
| CN | 101308803 A | 11/2008 |

(Continued)

*Primary Examiner* — Thinh T Nguyen
(74) *Attorney, Agent, or Firm* — Slater Matsil, LLP

(57) ABSTRACT

A semiconductor device and method of manufacture is provided. A reflowable material is placed in electrical connection with a through via, wherein the through via extends through an encapsulant. A protective layer is formed over the reflowable material. In an embodiment an opening is formed within the protective layer to expose the reflowable material. In another embodiment the protective layer is formed such that the reflowable material is extending away from the protective layer.

20 Claims, 13 Drawing Sheets

(51) Int. Cl.
*H01L 21/56* (2006.01)
*H01L 25/00* (2006.01)

(56) References Cited

U.S. PATENT DOCUMENTS

| | | | |
|---|---|---|---|
| 6,555,906 B2 | 4/2003 | Towle et al. | |
| 7,619,901 B2 * | 11/2009 | Eichelberger | H01L 21/6835 |
| | | | 361/763 |
| 8,039,303 B2 | 10/2011 | Shim et al. | |
| 8,072,059 B2 | 12/2011 | Shim et al. | |
| 8,097,490 B1 | 1/2012 | Pagaila et al. | |
| 8,133,762 B2 | 3/2012 | Pagaila et al. | |
| 8,193,604 B2 | 6/2012 | Lin et al. | |
| 8,283,205 B2 * | 10/2012 | Pagaila | H01L 21/561 |
| | | | 257/E21.007 |
| 8,291,584 B2 * | 10/2012 | Tanaka | H01L 23/49827 |
| | | | 29/832 |
| 8,319,338 B1 | 11/2012 | Berry et al. | |
| 8,330,273 B2 | 12/2012 | Brunnbauer et al. | |
| 8,354,304 B2 | 1/2013 | Chow et al. | |
| 8,361,842 B2 | 1/2013 | Yu et al. | |
| 8,474,133 B2 | 7/2013 | Eichelberger et al. | |
| 8,476,824 B2 | 7/2013 | Yu et al. | |
| 8,680,647 B2 | 3/2014 | Yu et al. | |
| 8,703,542 B2 | 4/2014 | Lin et al. | |
| 8,741,690 B2 | 6/2014 | Meyer et al. | |
| 8,742,579 B2 | 6/2014 | Pagaila et al. | |
| 8,759,147 B2 | 6/2014 | Choi et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 | 8/2014 | Lin et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,889,484 B2 | 11/2014 | Chen et al. | |
| 8,928,128 B2 | 1/2015 | Karikalan et al. | |
| 9,000,583 B2 | 4/2015 | Haba et al. | |
| 9,048,222 B2 | 6/2015 | Hung et al. | |
| 9,460,987 B2 | 10/2016 | Hung et al. | |
| 2005/0277550 A1 | 12/2005 | Brown et al. | |
| 2006/0038291 A1 | 2/2006 | Chung et al. | |
| 2006/0194331 A1 | 8/2006 | Pamula et al. | |
| 2007/0227765 A1 | 10/2007 | Sakamoto et al. | |
| 2007/0287230 A1 | 12/2007 | Kuramochi et al. | |
| 2008/0029886 A1 | 2/2008 | Cotte et al. | |
| 2008/0044944 A1 | 2/2008 | Wakisaka et al. | |
| 2008/0157330 A1 | 7/2008 | Kroehnert et al. | |
| 2008/0284035 A1 | 11/2008 | Brunnbauer et al. | |
| 2009/0053858 A1 | 2/2009 | Ko et al. | |
| 2009/0236752 A1 | 9/2009 | Lee et al. | |
| 2009/0293271 A1 * | 12/2009 | Tanaka | H01L 23/49827 |
| | | | 29/832 |
| 2010/0133704 A1 | 6/2010 | Marimuthu et al. | |
| 2011/0193216 A1 | 8/2011 | Lin et al. | |
| 2011/0291288 A1 | 12/2011 | Wu et al. | |
| 2012/0062439 A1 | 3/2012 | Liao et al. | |
| 2012/0112355 A1 * | 5/2012 | Pagaila | H01L 21/561 |
| | | | 257/773 |
| 2012/0119378 A1 | 5/2012 | Ng et al. | |
| 2012/0171814 A1 | 7/2012 | Choi et al. | |
| 2012/0199981 A1 | 8/2012 | Jeong et al. | |
| 2012/0208319 A1 | 8/2012 | Meyer et al. | |
| 2012/0231584 A1 | 9/2012 | Kawahara | |
| 2012/0319284 A1 | 12/2012 | Ko et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0105991 A1 | 5/2013 | Gan et al. | |
| 2013/0168848 A1 | 7/2013 | Lin et al. | |
| 2013/0187268 A1 | 7/2013 | Lin et al. | |
| 2013/0270685 A1 | 10/2013 | Yim et al. | |
| 2013/0297981 A1 | 11/2013 | Gu et al. | |
| 2013/0307140 A1 | 11/2013 | Huang et al. | |
| 2013/0328212 A1 | 12/2013 | Chino | |
| 2014/0061937 A1 | 3/2014 | Hu et al. | |
| 2014/0091471 A1 | 4/2014 | Chen et al. | |
| 2014/0110840 A1 | 4/2014 | Wojnowski et al. | |
| 2014/0203429 A1 | 7/2014 | Yu et al. | |
| 2014/0203443 A1 | 7/2014 | Pagaila et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0255431 A1 | 9/2015 | Su et al. | |
| 2015/0255432 A1 | 9/2015 | Lin et al. | |
| 2015/0255447 A1 | 9/2015 | Hung et al. | |
| 2016/0148857 A1 | 5/2016 | Lin et al. | |
| 2017/0229432 A1 | 8/2017 | Lin et al. | |

FOREIGN PATENT DOCUMENTS

| | | |
|---|---|---|
| CN | 102576682 A | 7/2012 |
| CN | 103219307 A | 7/2013 |
| CN | 103972191 A | 8/2014 |
| DE | 10110453 A1 | 5/2002 |
| DE | 102005040213 A1 | 3/2006 |
| DE | 102005043557 A1 | 9/2006 |
| DE | 102011001405 A1 | 10/2011 |
| JP | 2012199494 A | 10/2012 |
| KR | 20120077875 | 7/2012 |
| KR | 20120101885 | 9/2012 |
| KR | 20130035805 A | 4/2013 |
| KR | 20130052179 A | 5/2013 |
| KR | 20130116100 A | 10/2013 |
| KR | 20140043651 | 4/2014 |

* cited by examiner

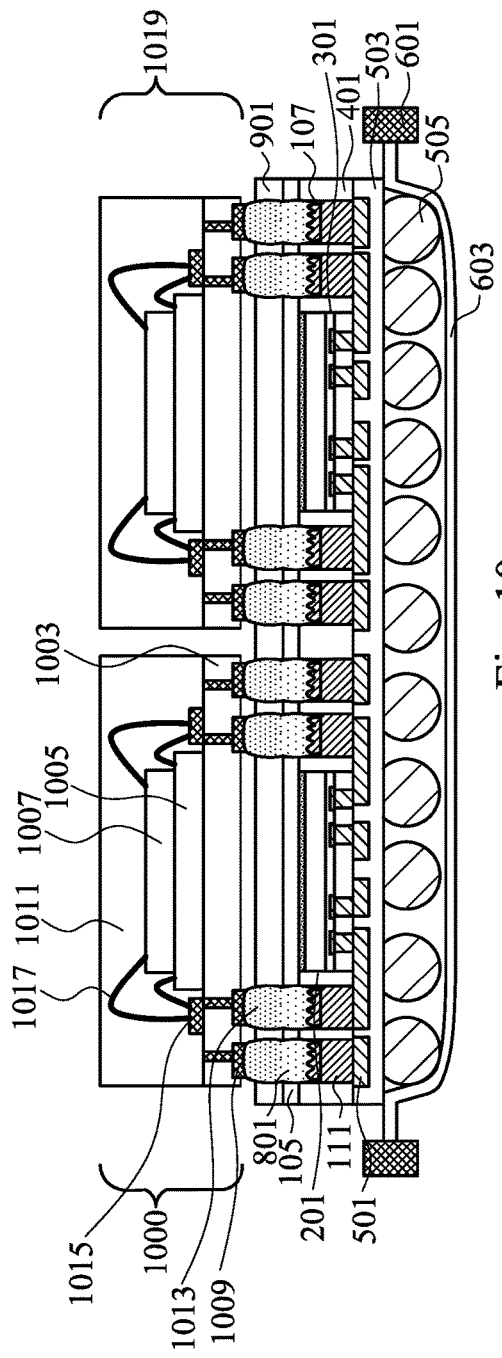
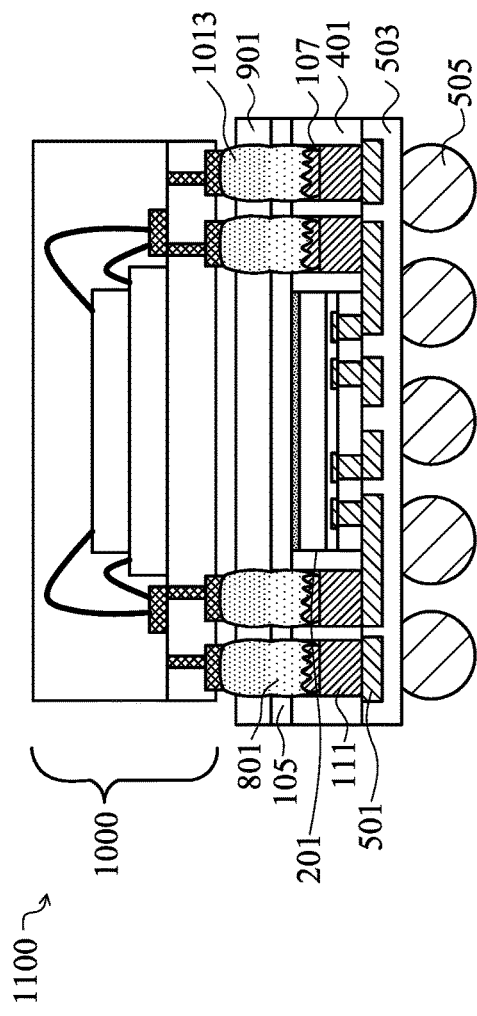

SEMICONDUCTOR DEVICE AND METHOD OF MANUFACTURES

This application is a divisional application of, and claims the benefit of, U.S. application Ser. No. 14/604,603, filed Jan. 23, 2015, entitled "Semiconductor Device and Method of Manufactures," which application is incorporated herein in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates bonding of another package, in accordance with some embodiments.

FIG. 11 illustrates a singulation of the semiconductor substrate, in accordance with some embodiments.

DETAILED DESCRIPTION

Figure 1:
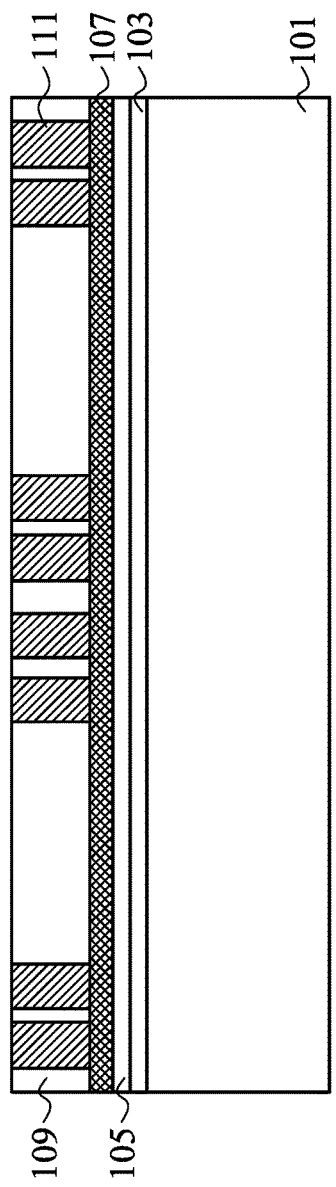
FIG. 1 illustrates formation of through vias, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103, a polymer layer 105, and a first seed layer 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2A-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, may alternatively be utilized. The polymer layer 105 may be placed using, e.g., a spin-coating process to a thickness of between about 0.5 μm and about 10 μm, such as about 5 μm, although any suitable method and thickness may alternatively be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 μm and about 1 μm, such as about 0.5 μm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 μm and about 250 μm, such as about 120 μm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may alternatively be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
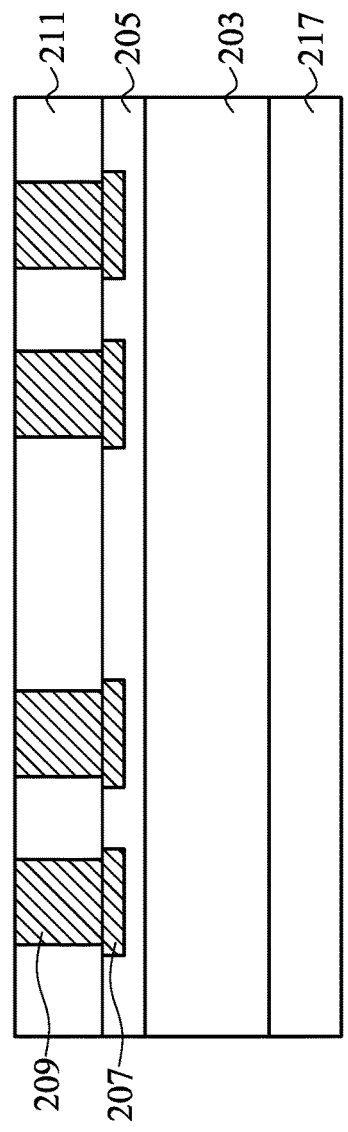
FIG. 2 illustrates embodiments of a first semiconductor device, in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 μm and about 4 μm, such as about 1.45 μm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 μm and about 5 μm, such as about 9.25 KÅ.

The first external connectors 209 may be formed to provide conductive regions for contact between the first contact pads 207 and, e.g., a redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 μm to about 20 μm, such as about 10 μm. The photoresist may be patterned to expose portions of the first passivation layers 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

A die attach film (DAF) 217 may be placed on an opposite side of the first substrate 203 in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
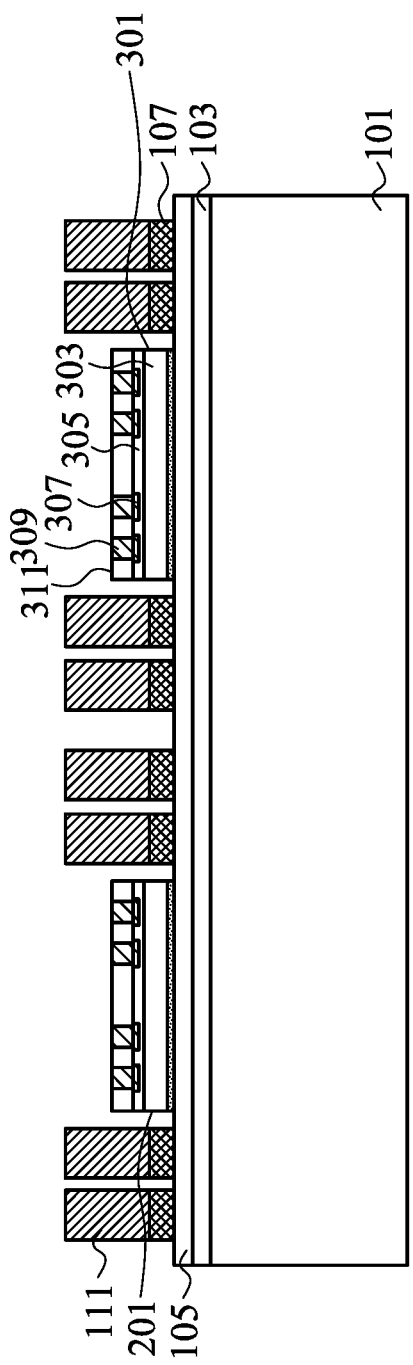
FIG. 3 illustrates a placement of the first semiconductor device between the through vias, in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301 may also be utilized.

Figure 4:
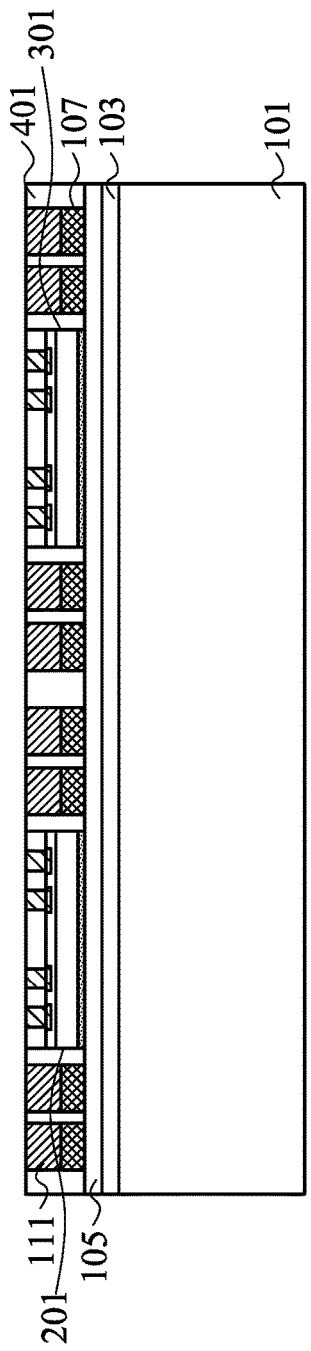
FIG. 4 illustrates an encapsulation of the first semiconductor device and through vias, in accordance with some embodiments.

FIG. 4 illustrates an encapsulation of the vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 111, the first semiconductor device 201, and the second semiconductor device 301.

During the encapsulation process the top molding portion may be placed adjacent to the bottom molding portion, thereby enclosing the first carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also planar with the encapsulant 401.

However, while the CMP process described above is presented as one illustrative embodiment, it is not intended to be limiting to the embodiments. Any other suitable removal process may alternatively be used to thin the encapsulant 401, the first semiconductor device 201, and the second semiconductor device 301 and expose the vias 111. For example, a series of chemical etches may be utilized. This process and any other suitable process may alternatively be utilized to thin the encapsulant 401, the first semiconductor device 201, and the second semiconductor device 301, and all such processes are fully intended to be included within the scope of the embodiments.

Figure 5:
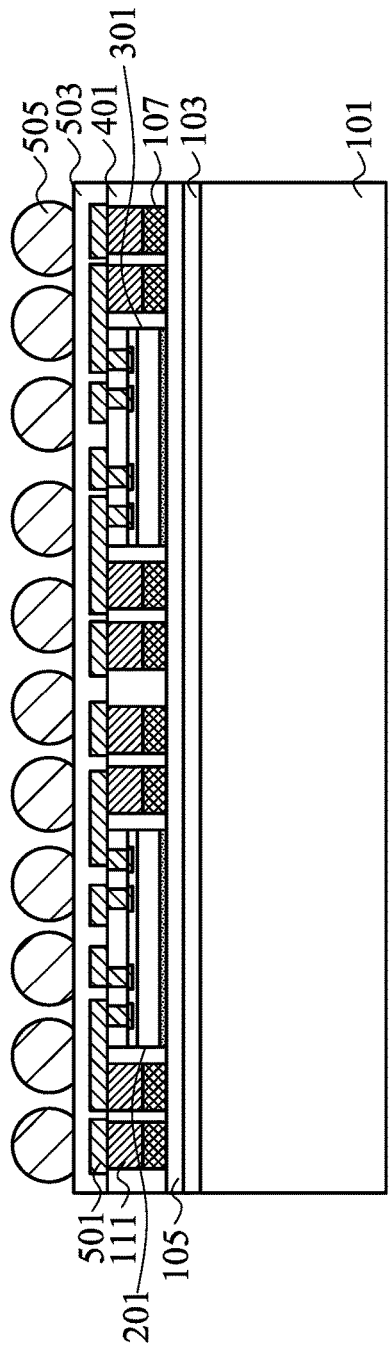
FIG. 5 illustrates formation of a redistribution layer and external connections, in accordance with some embodiments.

FIG. 5 illustrates a formation of a redistribution layer (RDL) 501 in order to interconnect the first semiconductor device 201, the second semiconductor device 301, the vias 111 and third external connectors 505. By using the RDL 501 to interconnect the first semiconductor device 201 and the second semiconductor device 301, the first semiconductor device 201 and the second semiconductor device 301 may have a pin count of greater than 1000.

In an embodiment the RDL 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the RDL 501 is desired to be located.

Once the photoresist has been formed and patterned, a conductive material, such as copper, may be formed on the seed layer through a deposition process such as plating. The conductive material may be formed to have a thickness of between about 1 μm and about 10 μm such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the RDL 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5 also illustrates a formation of a third passivation layer 503 over the RDL 501 in order to provide protection and isolation for the RDL 501 and the other underlying structures. In an embodiment the third passivation layer 503 may be polybenzoxazole (PBO), although any suitable material, such as polyimide or a polyimide derivative, may alternatively be utilized. The third passivation layer 503 may be placed using, e.g., a spin-coating process to a thickness of between about 5 μm and about 25 μm, such as about 7 μm, although any suitable method and thickness may alternatively be used.

In an embodiment the thickness of the structure from the third passivation layer 503 to the polymer layer 105 may be less than or equal to about 200 μm. By making this thickness as small as possible, the overall structure may be utilized in various small size applications, such as cell phones and the like, while still maintaining the desired functionality. However, as one of ordinary skill in the art will recognize, the precise thickness of the structure may be dependent at least in part upon the overall design for the unit and, as such, any suitable thickness may alternatively be utilized.

Additionally, while only a single RDL 501 is illustrated in FIG. 5, this is intended for clarity and is not intended to limit the embodiments. Rather, any suitable number of conductive and passivation layers, such as three RDL 501 layers, may be formed by repeating the above described process to form the RDL 501. Any suitable number of layers may be utilized.

FIG. 5 further illustrates a formation of the third external connectors 505 to make electrical contact with the RDL 501. In an embodiment after the third passivation layer 503 has been formed, an opening may be made through the third passivation layer 503 by removing portions of the third passivation layer 503 to expose at least a portion of the underlying RDL 501. The opening allows for contact between the RDL 501 and the third external connectors 505. The opening may be formed using a suitable photolithographic mask and etching process, although any suitable process to expose portions of the RDL 501 may be used.

In an embodiment the third external connectors 505 may be placed on the RDL 501 through the third passivation layer 503 and may be a ball grid array (BGA) which comprises a eutectic material such as solder, although any suitable materials may alternatively be used. Optionally, an underbump metallization may be utilized between the third external connectors 505 and the RDL 501. In an embodiment in which the third external connectors 505 are solder balls, the third external connectors 505 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the third external connectors 505 have been formed, a test may be performed to ensure that the structure is suitable for further processing.

Figure 6A:
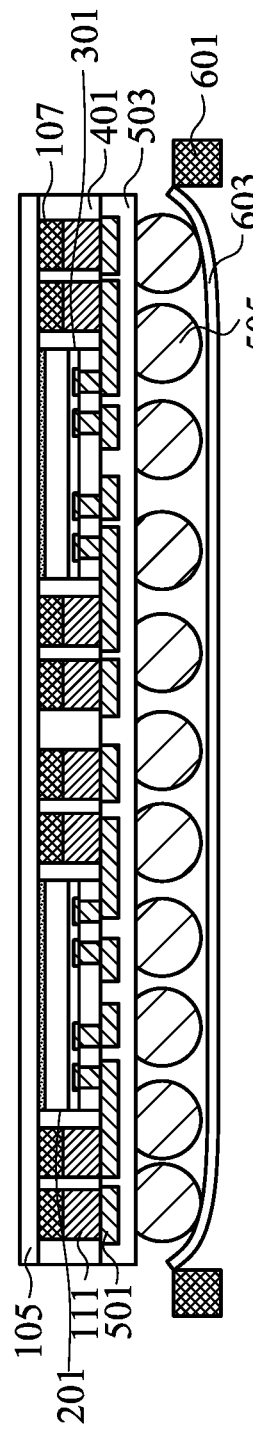
FIGS. 6A-6B illustrate a debonding of a carrier wafer, in accordance with some embodiments.

FIG. 6A illustrates a debonding of the first carrier substrate 101 from the first semiconductor device 201 and the second semiconductor device 301. In an embodiment the third external connectors 505 and, hence, the structure including the first semiconductor device 201 and the second semiconductor device 301, may be attached to a ring structure 601. The ring structure 601 may be a metal ring intended to provide support and stability for the structure during and after the debonding process. In an embodiment the third external connectors 505, the first semiconductor device 201, and the second semiconductor device 301 are attached to the ring structure using, e.g., a ultraviolet tape 603, although any other suitable adhesive or attachment may alternatively be used.

Once the third external connectors 505 and, hence, the structure including the first semiconductor device 201 and the second semiconductor device 301 are attached to the ring structure 601, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 505, the first semiconductor device 201, and the second semiconductor device 301.

Figure 6B:
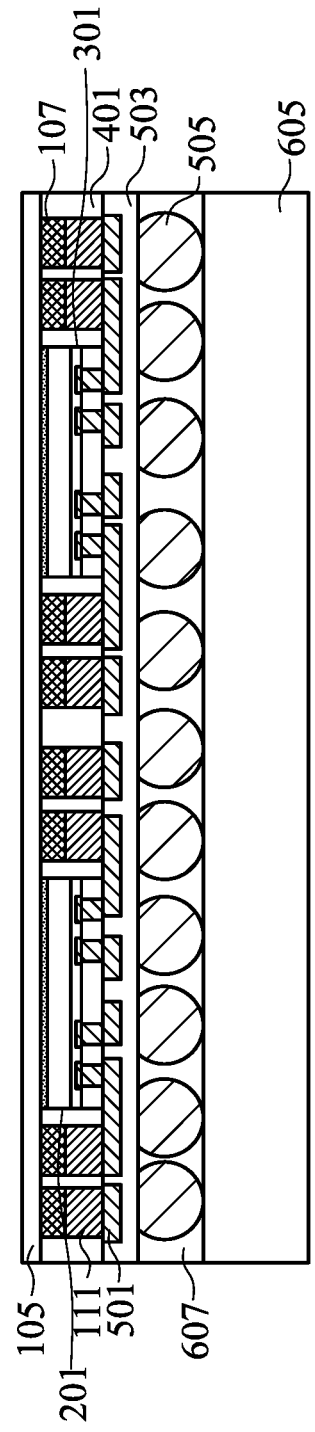

FIG. 6B illustrates another embodiment for debonding the first carrier substrate 101 from the first semiconductor device 201 and the second semiconductor device 301. In this embodiment the third external connectors 505 may be attached to a second carrier substrate 605 using, e.g., a first glue 607. In an embodiment the second carrier substrate 605 is similar to the first carrier substrate 101, although it may also be different. Once attached, the adhesive layer 103 may be irradiated and the adhesive layer 103 and the first carrier substrate 101 may be physically removed.

Figure 7A:
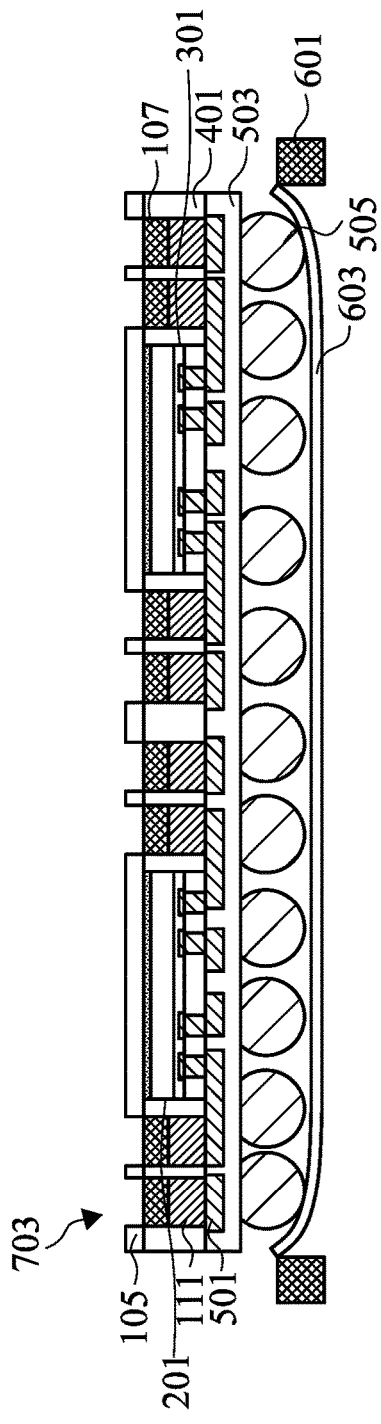
FIGS. 7A-7B illustrate an exposure of the through vias, in accordance with some embodiments.

Returning to an embodiment in which the ring structure 601 is utilized, FIG. 7A illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 7A) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form first openings 703 over the vias 111 to have a first width of between about 100 μm and about 300 μm, such as about 200 μm.

In another embodiment, the polymer layer 105 may be patterned by initially applying a photoresist (not individually illustrated in FIG. 7A) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 7B:
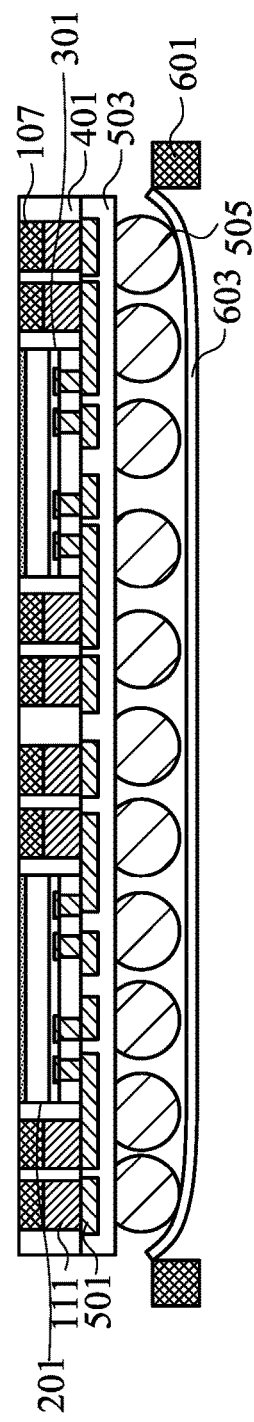

FIG. 7B illustrates another embodiment that may be utilized to expose the vias 111 for further connections. In this embodiment the polymer layer 105 is removed in its entirety in order to expose the vias 111 (and the associated first seed layer 107). In an embodiment the removal of the polymer layer 105 may be performed using, e.g., an etch back process whereby etchants are utilized to remove the polymer layer 105 until the vias 111 have been exposed. For example, in an embodiment in which the polymer layer 105 is PBO, an etchant may be utilized in a wet etch process to remove the polymer layer 105.

However, as one of ordinary skill in the art will recognize, the wet etch process described above is intended to be illustrative and is not intended to limit the embodiments. Rather, any suitable removal process, such as a chemical mechanical polish or a low debond energy process (which may result in a portion of the LTHC layer remaining on the polymer layer 105), hogomax free process may be used in order to save costs related to the protection layer. All such processes are fully intended to be included within the scope of the embodiments.

Figure 8:
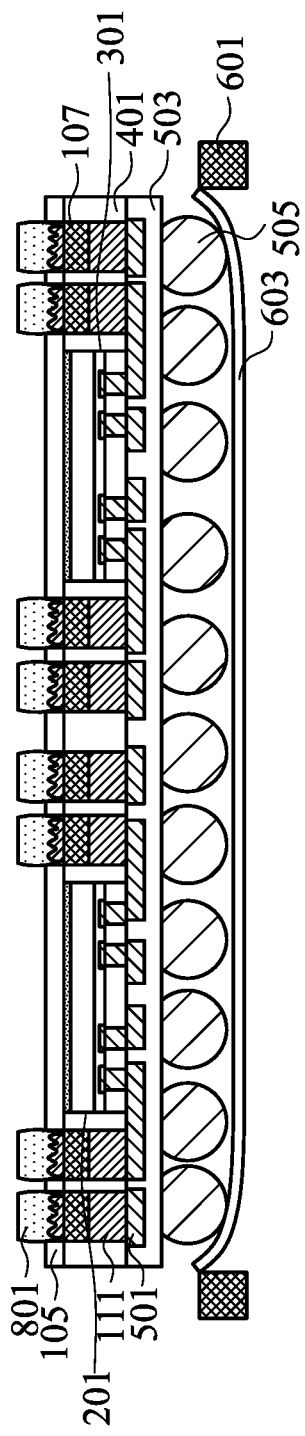
FIG. 8 illustrates a placement of a reflowable material, in accordance with some embodiments.

Returning now to the embodiment discussed with respect to FIG. 7A, FIG. 8 illustrates a placement of a backside ball pad 801 within the first openings 703 in order to protect the now exposed vias 111. In an embodiment the backside ball pads 801 may comprise a conductive material such as solder (e.g., a reflowable material) on paste or an oxygen solder protection (OSP), although any suitable material may alternatively be utilized. In an embodiment the backside ball pads 801 may be applied using a stencil, although any suitable method of application may alternatively be utilized, and then reflowed in order to form a bump shape.

FIG. 8 additionally illustrates an optional leveling or coining process that may be performed on the backside ball pads 801. In an embodiment the backside ball pads 801 may be physically shaped using, e.g., a stencil that is placed around each of the backside ball pads 801 and a press that applies pressure to physically deform the portions of the backside ball pads 801 and to flatten the top surface of the backside ball pads 801.

Figure 9:
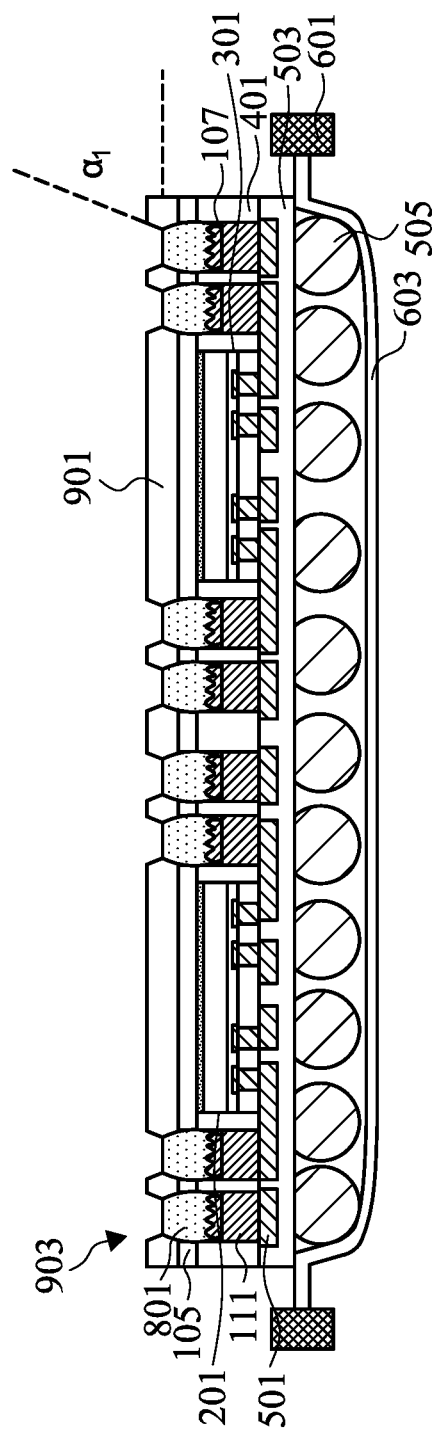
FIG. 9 illustrates a placement of a protective layer, in accordance with some embodiments.

FIG. 9 illustrates a placement and patterning of a backside protection layer 901 over the backside ball pads 801, effectively sealing the joint between the backside ball pads 801 and the vias 111 from intrusion by moisture. In an embodiment the backside protection layer 901 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 901 may be applied using a process such as screen printing, lamination, spin coating, or the like, to a thickness of between about 1 μm to about 200 μm.

FIG. 9 also illustrates that, once the backside protection layer 901 has been placed, the backside protection layer 901 may be patterned in order to expose the backside ball pads 801. In an embodiment the backside protection layer 901 may be patterned using, e.g., a laser drilling method, by which a laser is directed towards those portions of the backside protection layer 901 which are desired to be removed in order to expose the backside ball pads 801. During the laser drilling process the drill energy may be in a range from 0.1 mJ to about 30 mJ, and a drill angle of about 0 degree (perpendicular to the backside protection layer 901) to about 85 degrees to normal of the backside protection layer 901. In an embodiment the patterning may be formed to form second openings 903 over the backside ball pads 801, and the second openings 903 may be formed to have a diameter of between about 30 μm and about 300 μm, such as about 150 μm.

In another embodiment, the backside protection layer 901 may be patterned by initially applying a photoresist (not individually illustrated in FIG. 9) to the backside protection layer 901 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 901 are removed with, e.g., a dry etch process. However, any other suitable method for patterning the backside protection layer 901 may be utilized.

By utilizing a photolithographic process to pattern the backside protection layer 901, the shape of the second openings 903 may be controlled. For example, by using a photolithographic process the sidewalls formed during the formation of the second openings 903 may be controlled to have a first angle $\alpha_1$ that is greater than 75°. This allows the backside protection layer 901 to maintain the effective sealing of the backside ball pads 801 while still allowing for an effective connection between the backside ball pads 801 with other structures.

FIG. 10 illustrates a bonding of the backside ball pads 801 to a first package 1000. In an embodiment the first package 1000 may comprise a third substrate 1003, a third semiconductor device 1005, a fourth semiconductor device 1007 (bonded to the third semiconductor device 1005), third contact pads 1009, a second encapsulant 1011, and fourth external connections 1013. In an embodiment the third substrate 1003 may be, e.g., a packaging substrate comprising internal interconnects (e.g., through substrate vias 1015) to connect the third semiconductor device 1005 and the fourth semiconductor device 1007 to the backside ball pads 801.

Alternatively, the third substrate 1003 may be an interposer used as an intermediate substrate to connect the third semiconductor device 1005 and the fourth semiconductor device 1007 to the backside ball pads 801. In this embodiment the third substrate 1003 may be, e.g., a silicon substrate, doped or undoped, or an active layer of a silicon-on-insulator (SOI) substrate. However, the third substrate 1003 may alternatively be a glass substrate, a ceramic substrate, a polymer substrate, or any other substrate that may provide a suitable protection and/or interconnection functionality. These and any other suitable materials may alternatively be used for the third substrate 1003.

The third semiconductor device 1005 may be a semiconductor device designed for an intended purpose such as being a logic die, a central processing unit (CPU) die, a memory die (e.g., a DRAM die), combinations of these, or the like. In an embodiment the third semiconductor device 1005 comprises integrated circuit devices, such as transistors, capacitors, inductors, resistors, first metallization layers (not shown), and the like, therein, as desired for a particular functionality. In an embodiment the third semiconductor device 1005 is designed and manufactured to work in conjunction with or concurrently with the first semiconductor device 201.

The fourth semiconductor device 1007 may be similar to the third semiconductor device 1005. For example, the fourth semiconductor device 1007 may be a semiconductor device designed for an intended purpose (e.g., a DRAM die) and comprising integrated circuit devices for a desired functionality. In an embodiment the fourth semiconductor device 1007 is designed to work in conjunction with or concurrently with the first semiconductor device 201 and/or the third semiconductor device 1005.

The fourth semiconductor device 1007 may be bonded to the third semiconductor device 1005. In an embodiment the fourth semiconductor device 1007 is only physically bonded with the third semiconductor device 1005, such as by using an adhesive. In this embodiment the fourth semiconductor device 1007 and the third semiconductor device 1005 may be electrically connected to the third substrate 1003 using, e.g., wire bonds 1017, although any suitable electrical bonding may be alternatively be utilized.

Alternatively, the fourth semiconductor device 1007 may be bonded to the third semiconductor device 1005 both physically and electrically. In this embodiment the fourth semiconductor device 1007 may comprise fourth external connections (not separately illustrated in FIG. 10) that connect with fifth external connection (also not separately illustrated in FIG. 10) on the third semiconductor device 1005 in order to interconnect the fourth semiconductor device 1007 with the third semiconductor device 1005.

The third contact pads 1009 may be formed on the third substrate 1003 to form electrical connections between the third semiconductor device 1005 and, e.g., the fourth external connections 1013. In an embodiment the third contact pads 1009 may be formed over and in electrical contact with electrical routing (such as through substrate vias 1015) within the third substrate 1003. The third contact pads 1009 may comprise aluminum, but other materials, such as copper, may alternatively be used. The third contact pads 1009 may be formed using a deposition process, such as sputtering, to form a layer of material (not shown) and portions of the layer of material may then be removed through a suitable process (such as photolithographic masking and etching) to form the third contact pads 1009. However, any other suitable process may be utilized to form the third contact pads 1009. The third contact pads 1009 may be formed to have a thickness of between about 0.5 µm and about 4 µm, such as about 1.45 µm.

The second encapsulant 1011 may be used to encapsulate and protect the third semiconductor device 1005, the fourth semiconductor device 1007, and the third substrate 1003. In an embodiment the second encapsulant 1011 may be a molding compound and may be placed using a molding device (not illustrated in FIG. 10). For example, the third substrate 1003, the third semiconductor device 1005, and the fourth semiconductor device 1007 may be placed within a cavity of the molding device, and the cavity may be hermetically sealed. The second encapsulant 1011 may be placed within the cavity either before the cavity is hermetically sealed or else may be injected into the cavity through an injection port. In an embodiment the second encapsulant 1011 may be a molding compound resin such as polyimide, PPS, PEEK, PES, a heat resistant crystal resin, combinations of these, or the like.

Once the second encapsulant 1011 has been placed into the cavity such that the second encapsulant 1011 encapsulates the region around the third substrate 1003, the third semiconductor device 1005, and the fourth semiconductor device 1007, the second encapsulant 1011 may be cured in order to harden the second encapsulant 1011 for optimum protection. While the exact curing process is dependent at least in part on the particular material chosen for the second encapsulant 1011, in an embodiment in which molding compound is chosen as the second encapsulant 1011, the curing could occur through a process such as heating the second encapsulant 1011 to between about 100° C. and about 130° C., such as about 125° C. for about 60 sec to about 3000 sec, such as about 600 sec. Additionally, initiators and/or catalysts may be included within the second encapsulant 1011 to better control the curing process.

However, as one having ordinary skill in the art will recognize, the curing process described above is merely an exemplary process and is not meant to limit the current embodiments. Other curing processes, such as irradiation or even allowing the second encapsulant 1011 to harden at ambient temperature, may alternatively be used. Any suitable curing process may be used, and all such processes are fully intended to be included within the scope of the embodiments discussed herein.

In an embodiment the fourth external connections 1013 may be formed to provide an external connection between the third substrate 1003 and, e.g., the backside ball pads 801. The fourth external connections 1013 may be contact bumps such as microbumps or controlled collapse chip connection (C4) bumps and may comprise a material such as tin, or other suitable materials, such as silver or copper. In an embodiment in which the fourth external connections 1013 are tin solder bumps, the fourth external connections 1013 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the fourth external connections 1013 have been formed, the fourth external connections 1013 are aligned with and placed into physical contact with the backside ball pads 801, and a bonding is performed. For example, in an embodiment in which the fourth external connections 1013 are solder bumps (e.g., a reflowable material), the bonding process may comprise a reflow process whereby the temperature of the fourth external connections 1013 is raised to a point where the fourth external connections 1013 will liquefy and flow, thereby bonding the first package 1000 to the backside ball pads 801 once the fourth external connections 1013 resolidifies.

FIG. 10 additionally illustrates the bonding of a second package 1019 to the backside ball pads 801. In an embodiment the second package 1019 may be similar to the first package 1000, and may be bonded to the backside ball pads 801 utilizing similar processes. However, the second package 1019 may also be different from the first package 1000.

FIG. 11 illustrates a debonding of the third external connectors 505 from the ring structure 601 and a singulation of the structure to form a first integrated fan out package-on-package (InFO-POP) structure. In an embodiment the third external connectors 505 may be debonded from the ring structure 601 by initially bonding the first package 1000 and the second package 1019 to a second ring structure using, e.g., a second ultraviolet tape. Once bonded, the ultraviolet tape 603 may be irradiated with ultraviolet radiation and, once the ultraviolet tape 603 has lost its adhesiveness, the third external connectors 505 may be physically separated from the ring structure 601.

Once debonded, a singulation of the structure to form the first InFO-POP structure 1100 is performed. In an embodiment the singulation may be performed by using a saw blade (not shown) to slice through the encapsulant 401 and the polymer layer 105 between the vias 111, thereby separating one section from another to form the first InFO-POP structure 1100 with the first semiconductor device 201. However, as one of ordinary skill in the art will recognize, utilizing a saw blade to singulate the first InFO-POP structure 1100 is merely one illustrative embodiment and is not intended to be limiting. Alternative methods for singulating the first InFO-POP structure 1100, such as utilizing one or more etches to separate the first InFO-POP structure 1100, may alternatively be utilized. These methods and any other suitable methods may alternatively be utilized to singulate the first InFO-POP structure 1100.

By forming the backside protection layer 901 over the backside ball pads 801 and then opening the backside protection layer 901 as described above, moisture permeation into the interface between the backside ball pads 801 and the underlying structures (e.g., the vias 111) may be reduced or eliminated. In particular, the problem that arose from using a laser drill to form a large opening and then attempting to fill the opening with a ball joint may be eliminated. As such, delamination and reliability failures from the backside connections may be reduced or eliminated as well. Additionally, copper oxidation of the vias 111 due to the water permeation may also be avoided.

All of this allows other protective structures to be avoided. In a particular embodiment, by preventing water permeation and other reliability failures, structures such as underfills are not necessarily needed in order to protect the structures. Without the need for an underfill, an underfill may be avoided, thereby also allowing the high costs of underfill material and dispensing to be avoided. This leads to a more efficient process and a cheaper overall device.

Figure 12:
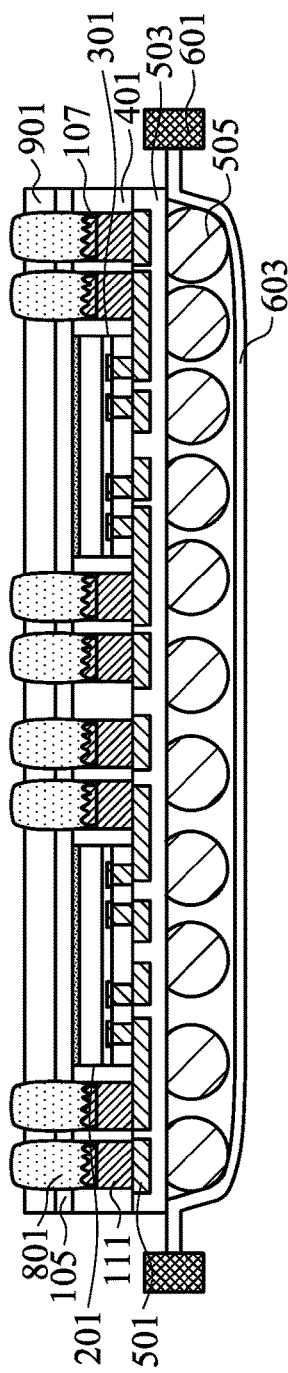
FIGS. 12-13B illustrate an embodiment in which the reflowable material extends from the protective layer, in accordance with some embodiments.

FIG. 12 illustrates another embodiment in which the backside ball pads 801 extend from the backside protection layer 901. In this embodiment, after the patterning of the polymer layer 105 (described above with respect to FIG. 7A), the backside ball pads 801 are placed and reflowed in the first openings 703 of the polymer layer 105. The backside ball pads 801 may be formed as described above with respect to FIG. 8. However, in this embodiment the backside ball pads 801 are formed to have a first height $H_1$ of between about 10 µm and about 100 µm, such as about 20 µm.

Once the backside ball pads 801 have been formed, the backside protection layer 901 may be formed over the polymer layer 105 and between the backside ball pads 801, and at least partially over a portion of the backside ball pads 801. In an embodiment the backside protection layer 901 may be formed as described above with respect to FIG. 9. However, in this embodiment the backside protection layer 901 may be formed to have a top surface that is lower than the backside ball pads 801. For example, in an embodiment in which the backside ball pads 801 have the first height $H_1$ of about 20 µm, the backside protection layer 901 may have a second height $H_2$ of between about 10 µm and about 80 µm, such as about 40 µm.

Figure 13A:
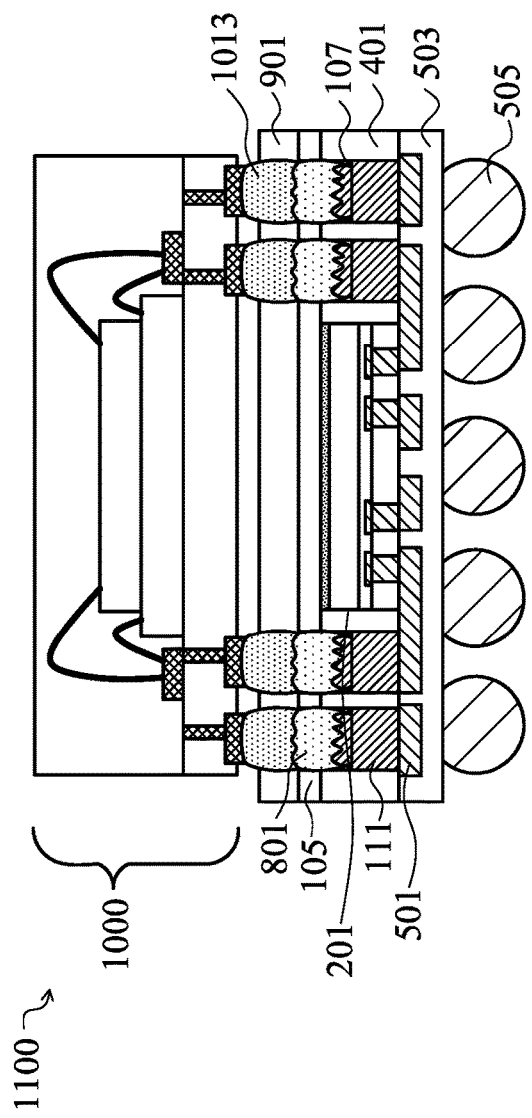

FIG. 13A illustrates a remainder of the process to form the first InFO-POP structure 1100 in this embodiment. In particular, the fourth external connections 1013 of the first package 1000 are aligned and bonded to the backside ball pads 801, and the first InFO-POP structure 1100 is singulated from the remainder of the structure. In an embodiment the bonding and singulation is performed as described above with respect to FIGS. 10-11, although any suitable methods may be utilized.

Figure 13B:
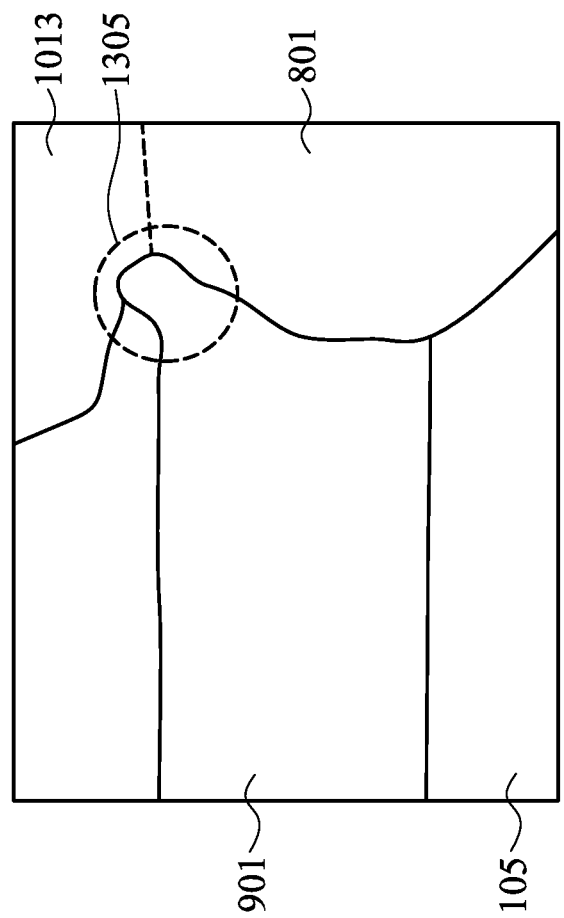

FIG. 13B illustrates a close-up view of an actual joint between the backside ball pads 801 and the fourth external connections 1013 in the embodiment illustrated in FIG. 13A. Given the formation of the backside protection layer 901 after the placement of the backside ball pads 801, the backside protection layer 901 will actually form a neck (represented in FIG. 16B by the dashed circle labeled 1305) that extends between the backside ball pads 801 and the fourth external connections 1013.

By utilizing an embodiment in which the backside ball pads 801 extend from the backside protection layer 901, there is no need for a laser drill process or a photolithographic process to form the second openings 903 through the backside protection layer 901. As such, these processes may be avoided.

Figure 14:
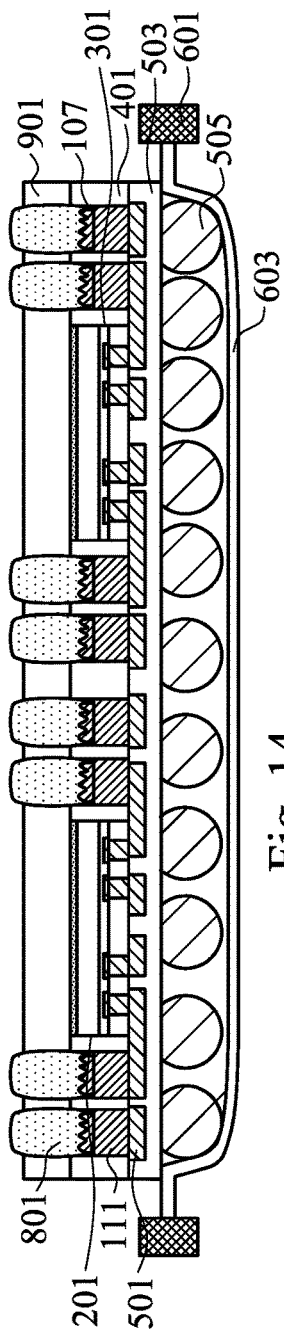
FIGS. 14-15 illustrate embodiments without a polymer layer, in accordance with some embodiments.

FIG. 14 illustrates another embodiment in which the backside ball pads 801 extend from the backside protection layer 901 but without the presence of the polymer layer 105. In this embodiment, after the removal of the polymer layer 105 as described above with respect to FIG. 7B, the backside ball pads 801 may be formed as described above with respect to FIG. 12 and in direct contact with the vias 111 (including the first seed layer 107). Additionally, the backside ball pads 801 are formed to the first height $H_1$ of between about 10 μm and about 100 μm, such as about 20 μm.

Once the backside ball pads 801 have been formed, the backside protection layer 901 may be formed in direct contact with the encapsulant 401 (because the polymer layer 105 has already been removed). In an embodiment the backside protection layer 901 may be formed as described above with respect to FIG. 12, the backside protection layer 901 is formed to have a top surface that is lower than the backside ball pads 801, such as by having the second height $H_2$.

Figure 15:
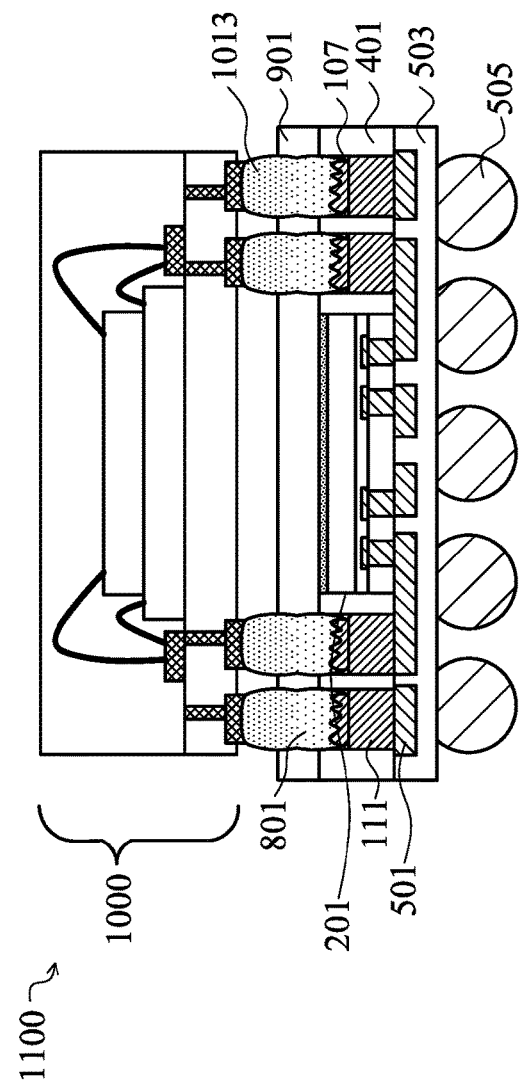

FIG. 15 illustrates a remainder of the process to form the first InFO-POP structure 1100 in this embodiment. In particular, the fourth external connections 1013 of the first package 1000 are aligned and bonded to the backside ball pads 801, and the first InFO-POP structure 1100 is singulated from the remainder of the structure. In an embodiment the bonding and singulation is performed as described above with respect to FIGS. 10-11, although any suitable methods may be utilized.

By removing the polymer layer 105 prior to forming the backside ball pads 801, the laser drill process that is utilized in other embodiments is not necessary. As such, the costs and complexity of the laser drill process may be avoided, and a reduction in damage from the laser drill process may be achieved.

Figure 16:
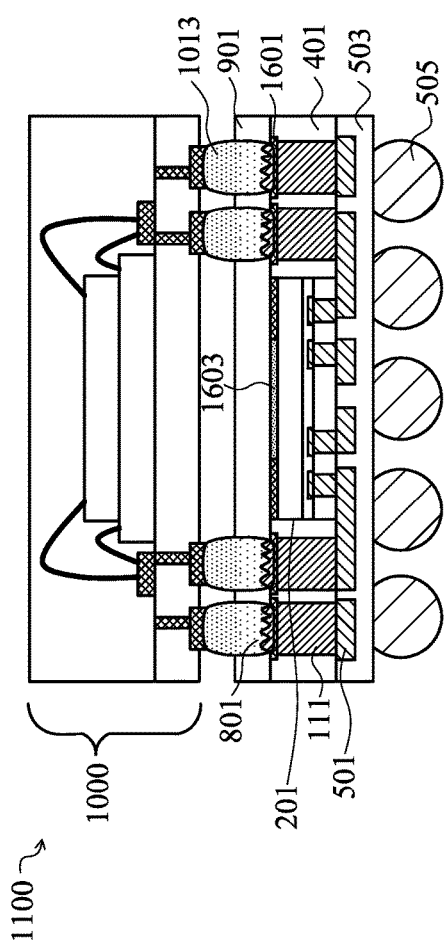
FIGS. 16-18 illustrates an embodiment utilizing a redistribution layer, in accordance with some embodiments.

FIG. 16 illustrates another embodiment which utilizes one or more backside redistribution layers (RDL) 1601. In this embodiment, after the encapsulant 401 has been removed so as to expose the vias 111, the backside RDL 1601 may be formed in electrical connection with the now exposed vias 111 and over the first semiconductor device 201. In an embodiment the backside RDL 1601 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the backside RDL 1601 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the backside RDL 1601.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 16 also illustrates a formation of a fourth passivation layer 1603 over the backside RDL 1601 in order to provide protection and isolation for the backside RDL 1601 and the other underlying structures. In an embodiment the fourth passivation layer 1603 may be polybenzoxazole (PBO), although any suitable material, such as polyimide or a polyimide derivative, may alternatively be utilized. The fourth passivation layer 1603 may be placed using, e.g., a spin-coating process to a thickness of between about 5 μm and about 25 μm, such as about 7 μm, although any suitable method and thickness may alternatively be used.

By utilizing the backside RDL 1601, the precise placement of the backside ball pads 801 does not need to be located directly over the vias 111. Rather, the backside ball pads 801 may be positioned as desired for the overall design. As such, a more efficient and smaller device may be achieved. Additionally, by utilizing the embodiments described herein, delamination of the backside RDL 1601 may be reduced or eliminated by sealing the joints from intrusion by moisture.

Figure 17A:
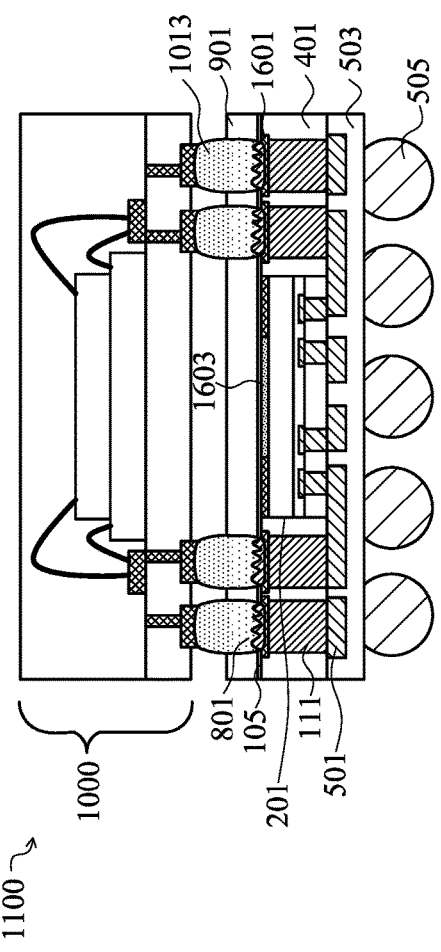
Figure 17B:
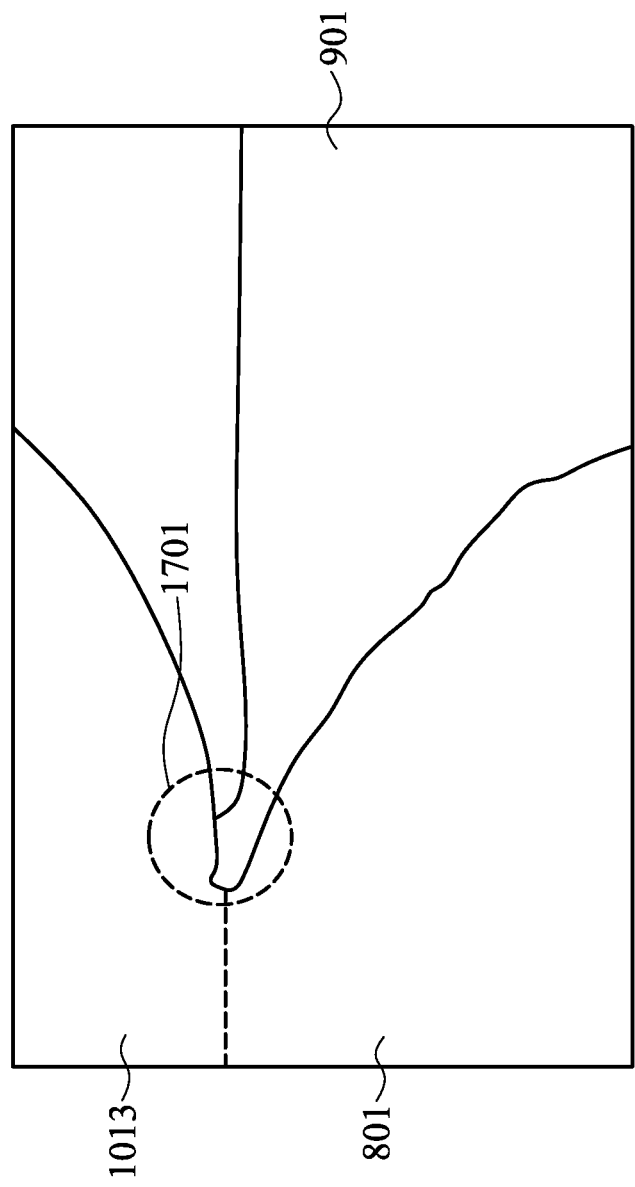

FIG. 17A illustrates another embodiment in which the embodiment illustrated above with respect to FIG. 13A is utilized along with the backside RDL 1601. Additionally, FIG. 17B illustrates a close up view of the joint between the backside ball pads 801 and the fourth external connections 1013. As with the embodiment discussed above with respect to FIG. 13B, because the backside ball pads 801 are formed prior to the placement of the backside protection layer 901, the backside protection layer 901 will actually extend between the backside ball pads 801 and the fourth external connections 1013 to form a second neck (illustrated in FIG. 17A within the dashed circle labeled 1701). This neck helps to seal the backside ball pads 801 such that moisture cannot penetrate. Additionally, while this neck is described within terms of the embodiment of FIG. 17A, the neck can also be found in the other embodiments in which the backside protection layer 901 is formed after the backside ball pads 801.

Figure 18:
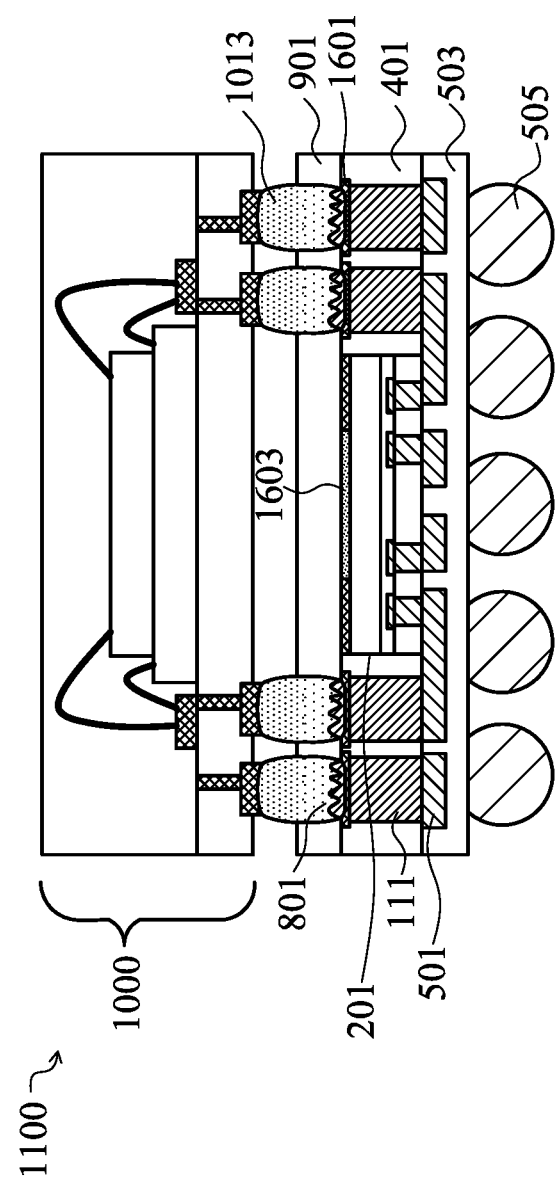

FIG. 18 illustrates another embodiment in which the backside RDL 1601 after the polymer layer 105 has been removed. In this embodiment after the polymer layer 105 has been removed (as described above with respect to FIG. 7B, the backside RDL 1601 may be formed prior to formation of backside ball pads 801 and the backside protection layer 901. By forming the backside RDL 1601, the backside ball pads 801 may be placed in any desired location.

In accordance with an embodiment, a semiconductor device comprising a first semiconductor die encapsulated by an encapsulant is provided. A through via extends through the encapsulant and is laterally separated from the first semiconductor die. A first reflowable conductive material is in electrical connection with the through via, and a protective layer is at least partially over the first reflowable conductive material and the first semiconductor die, wherein the protective layer has an opening that exposes the first reflowable conductive material.

In accordance with another embodiment, a semiconductor device comprising a first through via extending through an encapsulant and a first semiconductor die extending through the encapsulant, wherein at least a portion of the encapsulant is between the first through via and the first semiconductor die is provided. A protective layer is over the first through via and the first semiconductor die, the protective layer having a first height perpendicular with a major surface of the first semiconductor die. A first reflowable material extends through the protective layer, the first reflowable material having a second height perpendicular with the major surface of the first semiconductor die, the second height being greater than the first height.

In accordance with yet another embodiment, a method of manufacturing a semiconductor device comprising encapsulating a first semiconductor die and a through via within an encapsulant, wherein the encapsulating places at least a portion of the encapsulant between the first semiconductor die and the through via is provided. A first reflowable material is placed in electrical contact with the through via, and at least a portion of the first reflowable material is sealed by forming a protective layer after the placing the first reflowable material, wherein the first reflowable material is exposed by the protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   encapsulating a first semiconductor die and a through via within an encapsulant, wherein the encapsulating places at least a portion of the encapsulant between the first semiconductor die and the through via;
   placing a first reflowable material in electrical contact with the through via; and
   sealing at least a portion of the first reflowable material by forming a protective layer after the placing the first reflowable material, wherein the first reflowable material is exposed by the protective layer.

2. The method of claim 1, wherein the forming the protective layer further comprises:
   covering the first reflowable material with the protective layer; and
   forming an opening within the protective layer to expose the first reflowable material.

3. The method of claim 2, further comprising bonding a first package by placing a conductive material within the opening and in physical contact with the first reflowable material.

4. The method of claim 2, wherein the forming the opening further comprises a laser drilling process.

5. The method of claim 2, wherein the forming the opening further comprises a photolithographic masking and etching process.

6. A method of manufacturing a semiconductor device, the method comprising:
   forming a first insulating layer over a first substrate;
   forming through via extending through a molding compound on the first insulating layer;
   removing the first substrate;
   after removing the first substrate, forming a first opening in the first insulating layer, the first opening exposing the through via;
   forming a reflowable material in the first opening, the reflowable material being electrically coupled to the through via; and
   forming a second insulating layer over the first insulating layer, the second insulating layer having a second opening exposing the reflowable material.

7. The method of claim 6, further comprising, after forming the second insulating layer, bonding a second substrate to the reflowable material.

8. The method of claim 6, wherein the reflowable material physically contacts the through via.

9. The method of claim 6, wherein a sidewall of the second opening has an angle of at least 75°.

10. The method of claim 6, wherein a largest width of the reflowable material is larger than a width of the reflowable material at a surface of the second opening contacting the first insulating layer.

11. The method of claim 6, wherein forming the first opening comprises laser drilling.

12. The method of claim 6, wherein forming the second opening comprises laser drilling.

13. The method of claim 6, wherein forming the second insulating layer comprises depositing the second insulating layer to a thickness greater than a height of the reflowable material.

14. A method of manufacturing a semiconductor device, the method comprising:
   forming a through via extending through a molding compound over a first substrate;
   removing the first substrate;
   after removing the first substrate, forming a first reflowable material on the through via; and
   after forming the first reflowable material, forming a first insulating layer adjacent the first reflowable material, the first insulating layer having a first opening, the first insulating layer sealing at least a portion of the first reflowable material, wherein the first reflowable material is exposed through the first opening in the first insulating layer, a widest width of the first reflowable material being greater than a width of the opening.

15. The method of claim 14, further comprising, prior to forming the through via, forming a second insulating layer on the first substrate, the through via being formed on the second insulating layer.

16. The method of claim 15, further comprising, after removing the first substrate, forming a second opening in the second insulating layer, the first insulating layer being formed on the first insulating layer.

17. The method of claim 14, further comprising, after forming the first insulating layer, attaching a second substrate to the first reflowable material.

18. The method of claim 17, wherein attaching the second substrate comprises attaching a second reflowable material to the first reflowable material.

19. The method of claim 18, wherein the second reflowable material extends into the first opening in the first insulating layer.

20. The method of claim 14, wherein the first opening is formed by laser drilling.

* * * * *